United States Patent
Huang et al.

(10) Patent No.: US 8,404,565 B2
(45) Date of Patent: Mar. 26, 2013

(54) MANUFACTURING METHOD AND STRUCTURE OF A SURFACE-MOUNTING TYPE DIODE CO-CONSTRUCTED FROM A SILICON WAFER AND A BASE PLATE

(75) Inventors: Wen-Ping Huang, Taipei County (TW); Paul Wu, Taipei County (TW)

(73) Assignee: Formosa Microsemi Co., Ltd. (TW)

( * ) Notice: Subject to any disclaimer, the term of this patent is extended or adjusted under 35 U.S.C. 154(b) by 373 days.

(21) Appl. No.: 12/662,792

(22) Filed: May 4, 2010

(65) Prior Publication Data
US 2011/0272777 A1 Nov. 10, 2011

(51) Int. Cl.
*H01L 21/00* (2006.01)
(52) U.S. Cl. ............ 438/462; 257/109; 257/E21.544; 257/E21.599
(58) Field of Classification Search .............. 438/462, 438/461; 257/109, E21.544, E29.327, E21.599
See application file for complete search history.

(56) References Cited

U.S. PATENT DOCUMENTS

| | | | | |
|---|---|---|---|---|
| 3,489,961 A | * | 1/1970 | Frescura et al. | 257/508 |
| 4,016,593 A | * | 4/1977 | Konishi et al. | 257/116 |
| 4,667,189 A | * | 5/1987 | den Boer et al. | 345/90 |
| 4,811,079 A | * | 3/1989 | Turina et al. | 257/625 |
| 6,617,670 B2 | * | 9/2003 | Taylor et al. | 257/656 |
| 2007/0221944 A1 | * | 9/2007 | Cheol Yoo | 257/99 |

FOREIGN PATENT DOCUMENTS

JP 62060234 * 3/1997

OTHER PUBLICATIONS

Translation of Yajima (JP 62-060234 A), Mar. 1987, 8 pages.*

* cited by examiner

*Primary Examiner* — Caridad Everhart
(74) *Attorney, Agent, or Firm* — Bacon & Thomas, PLLC

(57) ABSTRACT

A manufacturing method and a structure of a surface-mounting type diode co-constructed from a silicon wafer and a base plate, in the method, a diffused wafer is stacked with a high temperature durable high strength base plate to have them sintered and molten together for connecting with each other to form a co-constructure; then the diffused wafer is processed by etching and ditching for filling with insulation material, electrodes of the diffused wafer are metalized and all on an identical plane, then production of all functional lines is completed; and then the co-constructure is cut to form a plurality of separated individuals which each forms a surface-mounting type diode to be applied straight. In comparison with the conventional techniques, manufacturing of the present invention is simplified and economic in reducing working hours, size and cost of production and the wafer is not subjected to breaking during manufacturing.

12 Claims, 13 Drawing Sheets

MANUFACTURING METHOD AND STRUCTURE OF A SURFACE-MOUNTING TYPE DIODE CO-CONSTRUCTED FROM A SILICON WAFER AND A BASE PLATE

BACKGROUND OF THE INVENTION

1. Field of the Invention

The present invention relates to a manufacturing method and a structure in relating to diodes; and especially to a manufacturing method and a structure of a surface-mounting type diode co-constructed from a silicon wafer and a base plate.

2. Description of the Prior Art

In the fields of industry, household electric appliances, electric power systems, traffic, commerce, aviation, computer communication and military usage, we can see the traces of using power electrons, and in the fields of power electronic techniques, surface-mounting type diodes are often used to meet various requirements.

As shown in FIG. 1, the method of manufacturing the above-mentioned surface-mounting type diodes generally is as below: a silicon wafer 100 made of silicon is subjected to functional lines making processes including etching 101, providing insulation layer 102 and surface metallizing 103, and then is subjected to silicon wafer cutting process 104 to get a plurality of individual grains, two electrodes of an individual grain each is extended to make an electric connecting pin 105, and then is subjected to a packing processes 106 to make a normally seen surface-mounting type diode.

Moreover, the structure of an above mentioned conventional surface-mounting type diode can have various styles according to the different styles of the above mentioned electric connecting pin and the insulation layer filled in.

As shown in FIG. 2, two electric connecting pins 2 for a grain 1 of the surface-mounting type diode are provided at the two electrodes of the left and right sides of the grain 1 respectively, and a packing layer 3 provided on the outer layer of the grain 1 can be formed by filling glass on outside of the grain 1.

Or as shown in FIG. 3, the two electrodes of the grain 1 of the surface-mounting type diode are provided on the upper and lower sides respectively of the grain 1, wherein one of the two electric connecting pins 2 are provided at the lower electrode of the grain 1; further, the grain 1 is provided at the upper electrode thereof with the other of the two electric connecting pins 2 by connecting in the mode of wire bonding, and is filled on its outside with glass or the epoxy resin packing layer 3 for protecting the grain 1 itself.

And as shown in FIG. 4, the two electrodes of the grain 1 of the surface-mounting type diode are provided respectively on the upper and the lower sides of the grain 1, and the upper and the lower sides of the grain 1 are provided by welding each with a electric connecting pin 2, the electric connecting pins 2 are bent to the same side in order to be used conveniently, and the epoxy resin forms the packing layer 3 for covering, fixing and protecting the grain 1 and the electric connecting pins 2.

Although the above stated three kinds of electric connecting pins 2 and the packing layer 3 all have their functions of protecting; after cutting out grains 1 from the silicon wafer, each grain 1 is provided with electric connecting pins 2 and a packing layer 3, this is working hour consumptive and is subjected to increasing cost too. And more, in etching the silicon wafer, a problem of ditching, etching or fracturing in grinding process is easily incurred being due to insufficient strength or stiffness, this is a problem hurriedly needed to be solved.

Hence as for a manufacturer of surface-mounting type diodes, the following list problems are all hurriedly needed to be solved: to improve to eliminate insufficiency of strength of material for silicon wafers, to pack and protect grains, to simplify the process of producing surface-mounting type diodes.

In view of this, the inventor of the present invention developed a manufacturing method and a structure of a surface-mounting type diode co-constructed from a silicon wafer and a base plate based on his professional experience of years in studying in the related field, the present invention can eliminate the problem of ditching, etching or fracturing in grinding process being due to insufficient strength or stiffness, and the process of packing can be omitted, thus volume of the element can be reduced, and cost of production can be lowered.

SUMMARY OF THE INVENTION

The object of the present invention is to provide a manufacturing method and a structure of a surface-mounting type diode co-constructed from a silicon wafer and a base plate, with the method and the structure, strength of material of the diodes can be increased to avoid breaking during processing, so that an object of simplifying process, reducing size and lowering cost of production can be can be attained.

In order to achieve the above object, in the "manufacturing method and the structure of a surface-mounting type diode co-constructed from a silicon wafer and a base plate" of the present invention, the manufacturing method comprises the following steps:

1. The first step: a diffused wafer is stacked with a high temperature durable high strength base plate to have them sintered as well as molten together for connecting with each other, so that the diffused wafer and the base plate form a co-constructure.
2. The second step: the diffused wafer is processed on its surface by etching to make a plurality of ditches separated with one another, in order that the diffused wafer is formed thereon a plurality of electrodes separated with one another and all on an identical plane.
3. The third step: the ditches separated with one another on the diffused wafer are filled therein with insulation material, in order that the electrodes separated with one another and provided on the identical plane are mutually insulated and separated.
4. The fourth step: the surface of the electrodes of the diffused wafer are metalized to make extension of the electric conductive character of wafer to the electrodes, and production of all functional lines required can be completed.
5. The fifth step: the co-constructure formed from the diffused wafer and the base plate is cut to form a plurality of separated individuals, the surface of each of the individuals has two electrodes provided on the identical plane and mutually insulated and separated, such that each individual forms a surface-mounting type diode to be applied straight.

In the above process of manufacturing, if the diffused wafer is a single surface diffused type, the two electrodes provided on the identical plane and mutually insulated and separated of the aforesaid surface-mounting type diode are made respectively a P/P type and an N/N type electrode, the diode thereby is formed a two way surface-mounting type diode.

The mode of practicing the manufacturing process of the present invention is specified in detail as below:

In the above stated first step, for the purpose of easily sintering and melting for connecting the wafer with the base plate, the wafer and the base plate can be provided therebetween with a kind of high temperature durable alloy soldering material.

In practicing, the base plate can be made of non-conductive material, for instance: ceramic, glass etc., and the top surface of the ceramic or glass base plate can be provided with a metalized connecting layer in order to achieve the object of easily stacking sintering and melting for connecting the wafer with the base plate. In practicing, the connecting layer on the ceramic base plate can be made by a printing mode a thick film connecting layer, or can be made by an electric plating mode a thin film connecting layer.

Moreover, for the purpose of getting a better heat scattering effect, in practicing, the base plate can be made of conductive material, for instance: gold, silver, copper, iron or aluminum etc., or of semiconductor of higher resistance value. If the material of the base plate is conductive material or non-conductive material in practicing, its bottom shall be provided with a protecting layer to protect the diffused wafer for insulating and avoid getting wetting. By the fact that the base plate is less subjected to deformation than the diffused wafer, and has large stiffness, after co-construction of the diffused wafer with the base plate by sintering and melting for connecting, if the diffused wafer is etching ditched overly deep, or the diffused wafer is ground to be too thin, the diffused wafer will be not subjected to having the problem of breaking in the subsequent stage of process, thereby we are not afraid of being collided with of the diffused wafer, and further an effect of having the volume of the diffused wafer reduced can be provided.

In the above third step, in practicing, the ditches separated with one another on the diffused wafer are filled with insulation material, for instance, by filling glass or providing an oxidized layer etc. in order to achieve the effect of separating the electrodes.

In the above fourth step, the purpose that the electrodes on the surface of the diffused wafer are metalized is to make the electrodes more easier to be stuck or soldering connected, and all the production of the functional lines can be completed, after metallization, each of the surface metalized electrodes can be added with a metallic electrode plate by the mode of printing or high temperature soldering; providing of the metallic electrode plate can be performed after the process of cutting in the fifth step.

Besides, for the purpose of strengthen insulation and protection for each surface-mounting type diode after the process of manufacturing, the surface-mounting type diode can be provided on its outer surface, except the electrodes, with an insulation layer; in practicing, the insulation layer can be made of solid or liquid epoxy resin or insulating glue that can achieve the object of insulation and protection.

In the above manufacturing process, the diffused wafer is a single surface diffused type, a single surface diffused type silicon grain can be formed after cutting, the two electrodes which are provided on the identical plane and mutually insulated and separated of the surface-mounting type diode can be made respectively a P/P type and an N/N type electrode, the diode thereby is formed a two way surface-mounting type diode.

The structure of the two way surface-mounting type diode is as below:

The surface-mounting type diode comprises: a single surface diffused type silicon grain and a base plate being co-constructed with a bottom surface of the silicon grain by sintering and melting for connecting with each other, wherein the bottom surface of the silicon grain and the base plate are provided therebetween with a kind of high temperature durable alloy soldering material, for the purpose of mutually sintering and melting for connecting of the bottom surface of the silicon grain with the base plate, and the two electrodes of the silicon grain are provided therearound with mutually separated ditches for filling therein with insulating materials, in order to separate the two electrodes provided on an identical plane, which electrodes are respectively a P/P type and an N/N type electrode, the outer surface of each electrode is provided with a metalized electric conductive layer.

In practicing, the base plate can be made of non-conductive material, for instance: ceramic, glass etc., and the top surface of the ceramic or glass base plate can be provided with a metalized connecting layer in order to achieve the object of easily stacking sintering and melting for connecting the diffused wafer with the base plate. In practicing, the connecting layer on the ceramic base plate can be made by a printing mode a thick film connecting layer, or can be made by an electric plating mode a thin film connecting layer.

Moreover, for the purpose of getting a better heat scattering effect, in practicing, the base plate can be made of conductive material, for instance: gold, silver, copper, iron or aluminum etc., or of semiconductor of higher resistance value. If the material of the base plate is conductive material or non-conductive material in practicing, the bottom of the metallic base plate shall be provided with a protecting layer to protect the diffused wafer for insulating and avoid getting wetting. Additionally, in practicing, for the purpose of being convenient for processing and assembling, the outer surface of the metalized electric conductive layer can, in pursuance of requirement, be provided further with another metallic electrode plate being convenient for assembling.

Moreover, for the purpose of strengthen insulation and protection for each surface-mounting type diode, in practicing, the surface-mounting type diode can be provided on its outer surface, except the electrodes, with an insulation layer; in practicing, the insulation layer can be made of solid or liquid epoxy resin or insulating glue that can achieve the object of insulation and protection.

In the above manufacturing process, if the diffused wafer is a two surface diffused type, it can be formed a two surface diffused type silicon grain after cutting, thereby the two electrodes which are provided on an identical plane and mutually insulated and separated of the surface-mounting type diode can be P/N type electrodes, the diode thereby is formed a one way surface-mounting type diode.

The difference between this embodiment of manufacturing process of the one way surface-mounting type diode and the precedent step is: by virtue that the diffused wafer is a two surface diffused type, the diffused wafer must be separated to make the electrodes arranged in PPNNPP . . . , therefore during processing of the third step, it is not necessary to fill insulating material in the ditches between N/N, so that in the fourth step, the ditches between N/N and the surfaces of the P, N type electrodes can be metalized simultaneously; the ditches between N/N can be provided by the processes of etching and ditching or yellow light development before the fourth step.

In this embodiment, when the surfaces of the diffused wafer in the fourth step are metalized, the metalized areas also include surfaces of the ditches between N/N of the electrodes, hence before cutting in the fifth step, the ditches between N/N are filled therein with insulating material, and after cutting of the fifth step, a plurality of surface-mounting type diodes can be obtained, and a surface of each surface-mounting type diode has two P/N type electrodes provided on the identical plane and mutually insulated and separated, and further each surface-mounting type diode can be applied directly; filling of the insulating material can also be performed by the mode of dipping, shaping etc. after cutting of the fifth step.

The structure of the one way surface-mounting type diode in the preceding step is as below:

The surface-mounting type diode comprises: a two surface diffused type silicon grain and a base plate being co-constructed with a bottom surface of the silicon grain by sintering and melting for connecting with each other, wherein the bottom surface of the silicon grain and the base plate are provided therebetween with a kind of high temperature durable alloy soldering material, for the purpose of mutually sintering and melting for connecting of the silicon grain with the base plate, and the two electrodes of the silicon grain are provided therearound with mutually separated ditches for filling therein with insulating materials, in order to separate the two P/N electrodes provided on an identical plane, the surface of each electrode is metalized to provide an electric conductive layer, the electric conductive layer is extended from one of the electrodes to an area between a separating ditch (beside the silicon grain) and the insulating material. The other mode of practicing of the one way surface-mounting type diode in this embodiment is same as that for the two way surface-mounting type diode stated above, and no further narration is needed here.

In comparison with the conventional technique, the manufacturing method and a structure of a surface-mounting type diode co-constructed from a silicon wafer and a base plate of the present invention can have the manufacturing process simplified to reduce its working hours, and the diffused wafer not only is not subjected to breaking during manufacturing, but also the surface-mounting type diode after cutting and shaping can be used directly, and further has an effect of reducing volume and being convenient for use.

The present invention will be apparent in the light of the technical measures thereof after reading the detailed description of the preferred embodiment thereof in reference to the accompanying drawings.

DETAILED DESCRIPTION OF THE PREFERRED EMBODIMENT

Figure 1:
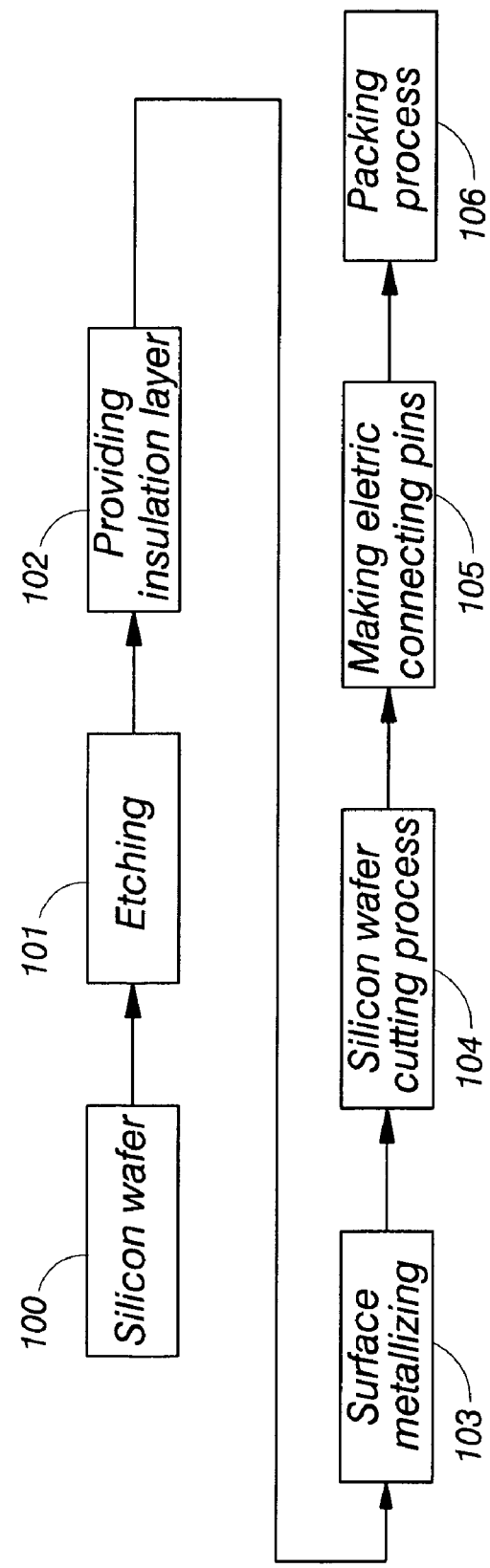
FIG. 1 is a flow chart showing the process of manufacturing of a conventional surface-mounting type diode.
Figure 2:
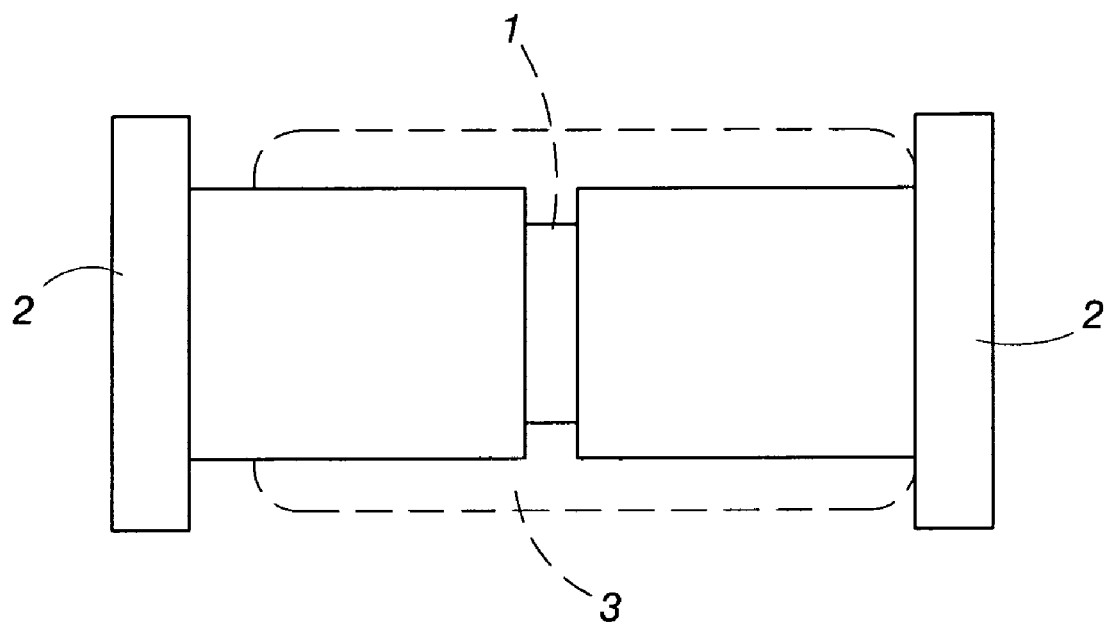
FIG. 2 is a side view of the structure of a conventional surface-mounting type diode showing electrical connecting pins are provided on two electrodes at two lateral sides of a grain.
Figure 3:
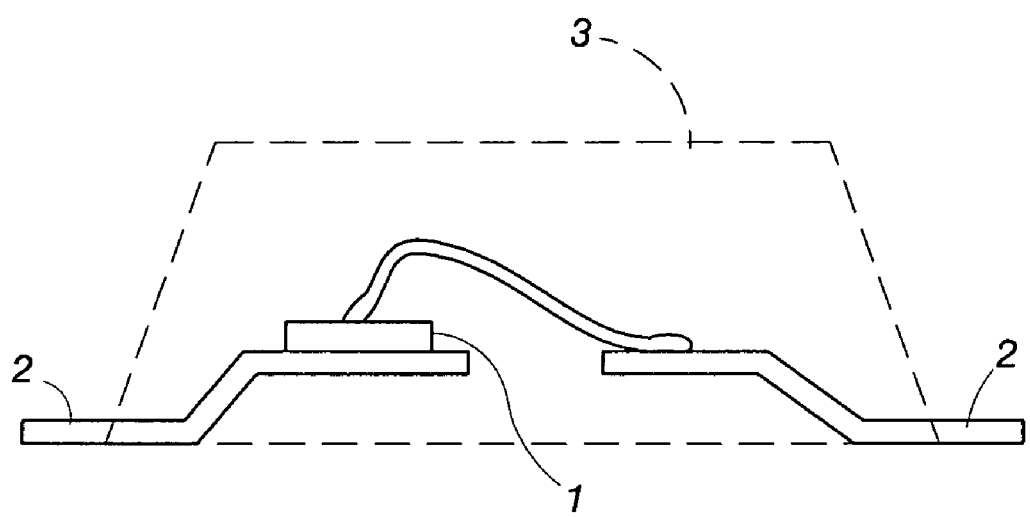
FIG. 3 is a side view of the structure of a conventional surface-mounting type diode showing two electrodes are provided at an upper and a lower lateral side respectively of a grain; wherein an electrical connecting pin is provided beneath a lower one of the two electrodes, and another electrical connecting pin is provided and connected by the mode of wire bonding at the upper electrode.
Figure 4:
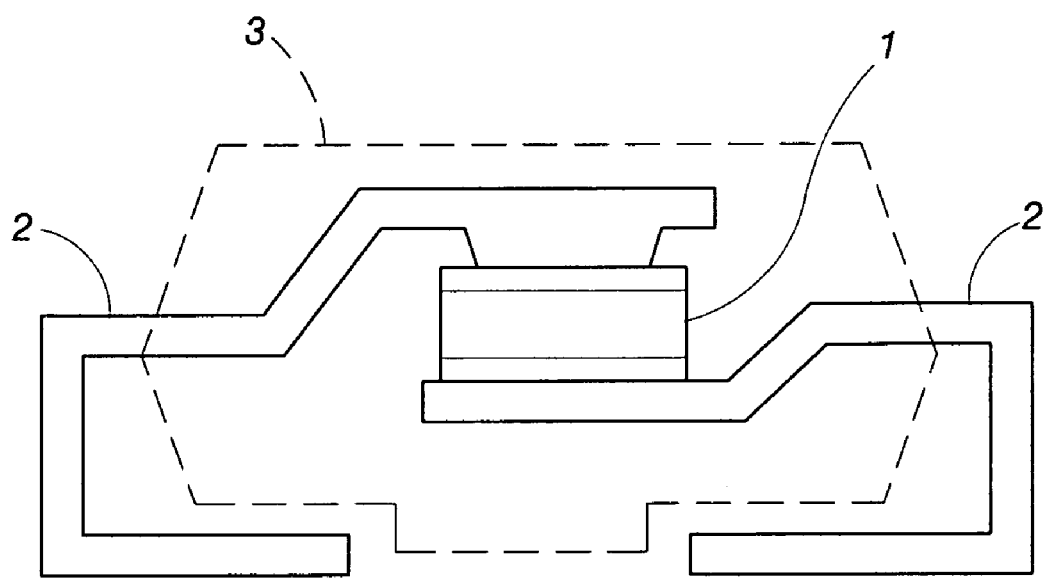
FIG. 4 is a side view of the structure of a conventional surface-mounting type diode showing two electrodes are provided at an upper and a lower lateral side respectively of a grain; and the upper and the lower lateral sides of the grain each is provided with an electrical connecting pin by the mode of welding connecting, and the electrical connecting pins are bent both to one side.
Figure 5:
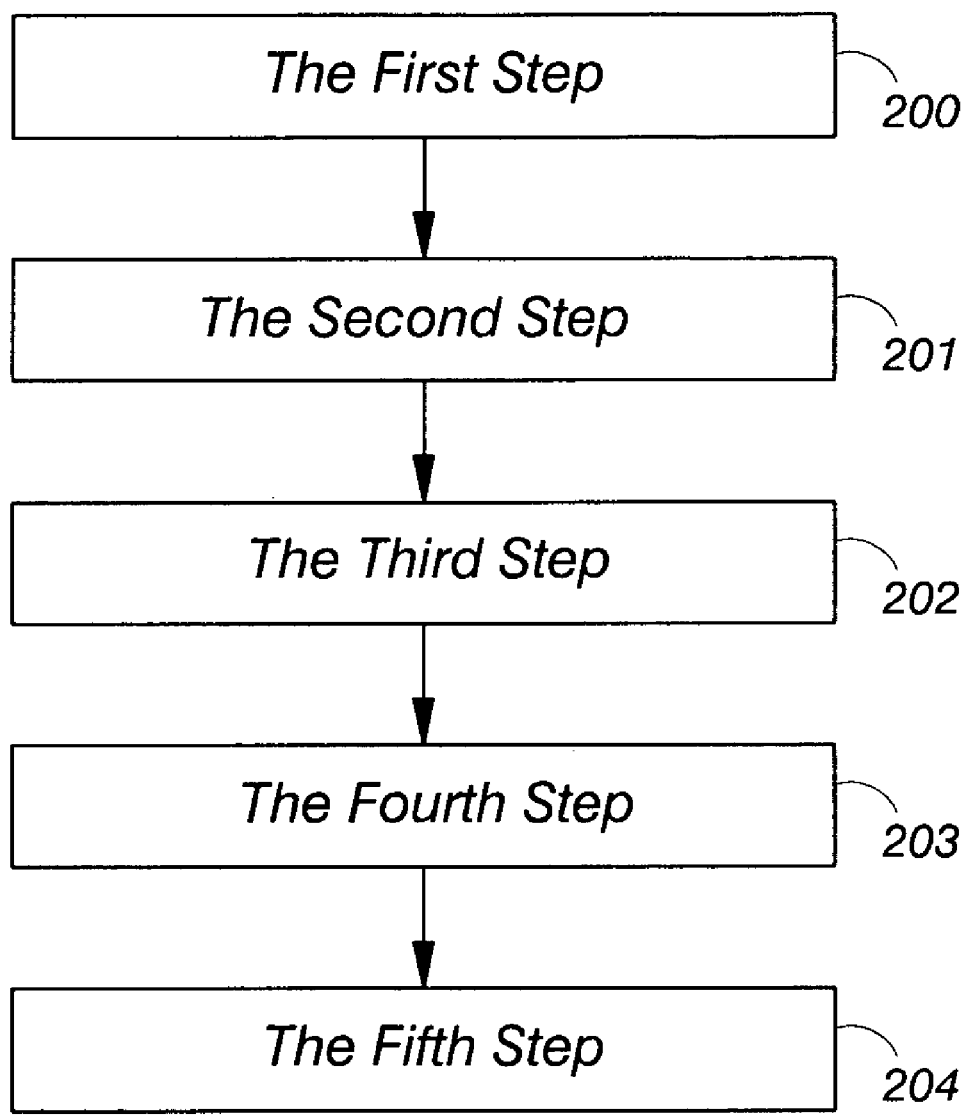
FIG. 5 is a flow chart showing the process of manufacturing of the present invention.
Figure 6:
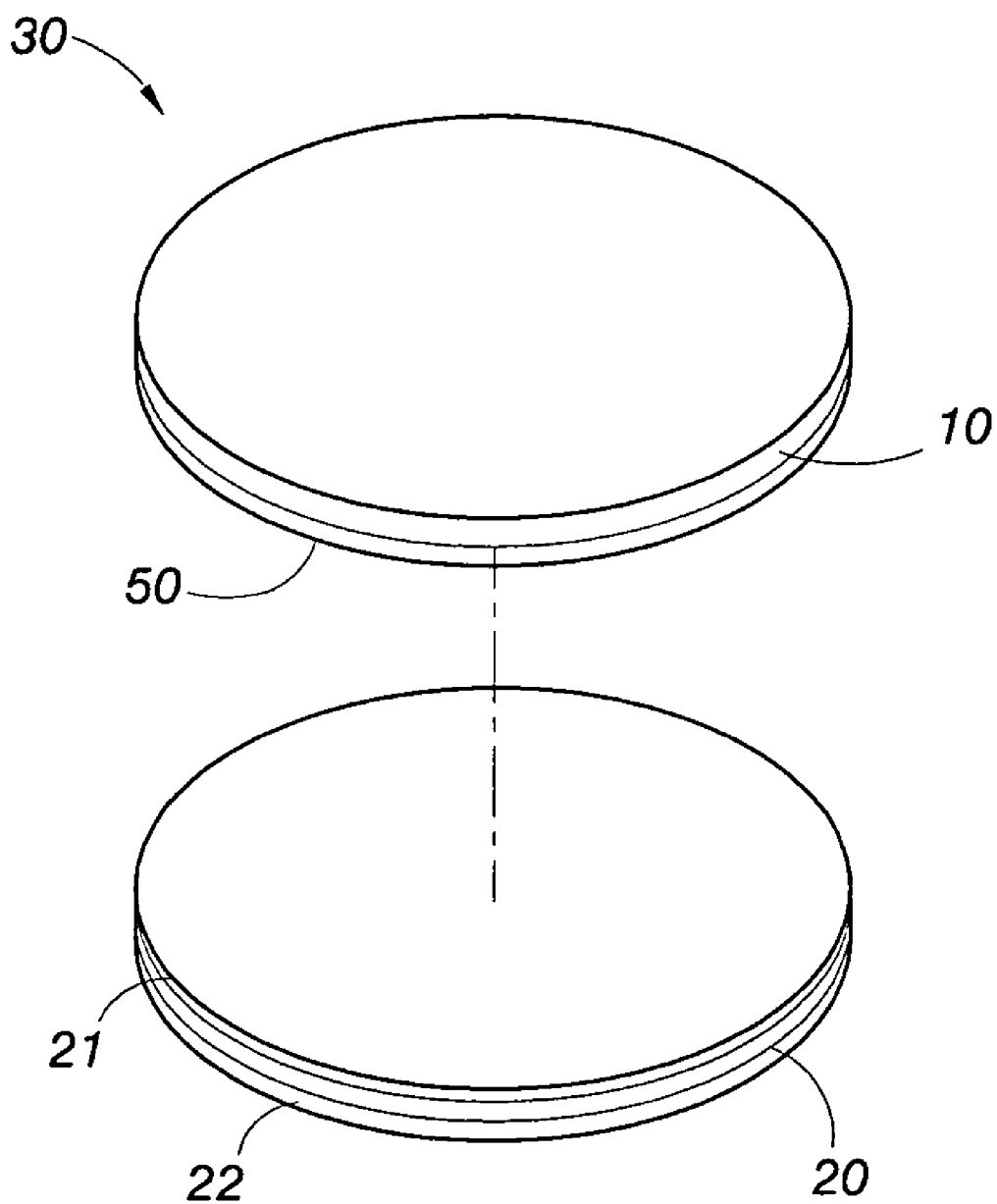
FIG. 6 is an anatomic perspective view of a co-constructure formed by stacking sintering and melting for connecting of a diffused wafer and a base plate.
Figure 7:
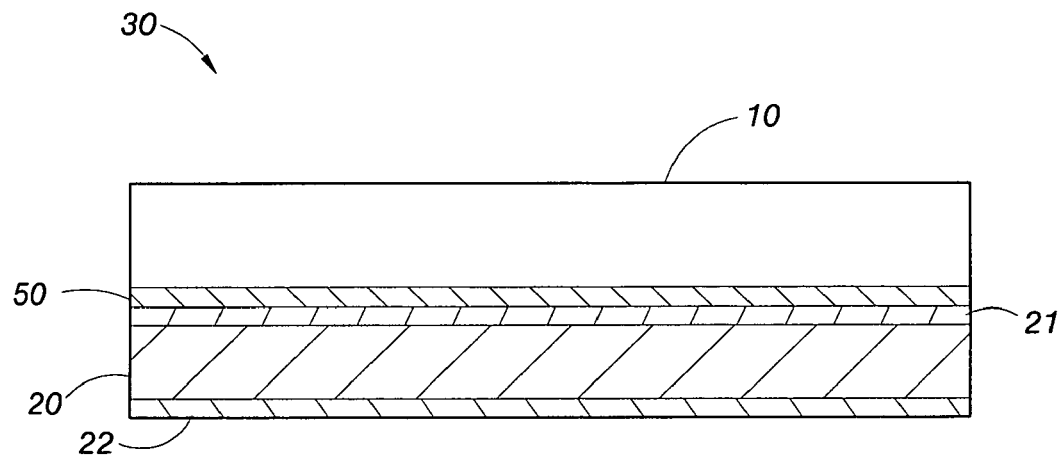
FIG. 7 is a schematic side view of the co-constructure formed by stacking sintering and melting for connecting of a diffused wafer and a base plate.

Referring to FIG. 5 to 7, the manufacturing method and a structure of a surface-mounting type diode co-constructed from a silicon wafer and a base plate of the present invention comprises the following steps:

1. The first step 200: a diffused wafer 10 is stacked with a high temperature durable high strength base plate 20 to have them sintered as well as molten together for connecting with each other, so that the diffused wafer 10 and the base plate 20 form a co-constructure 30.

Figure 8:
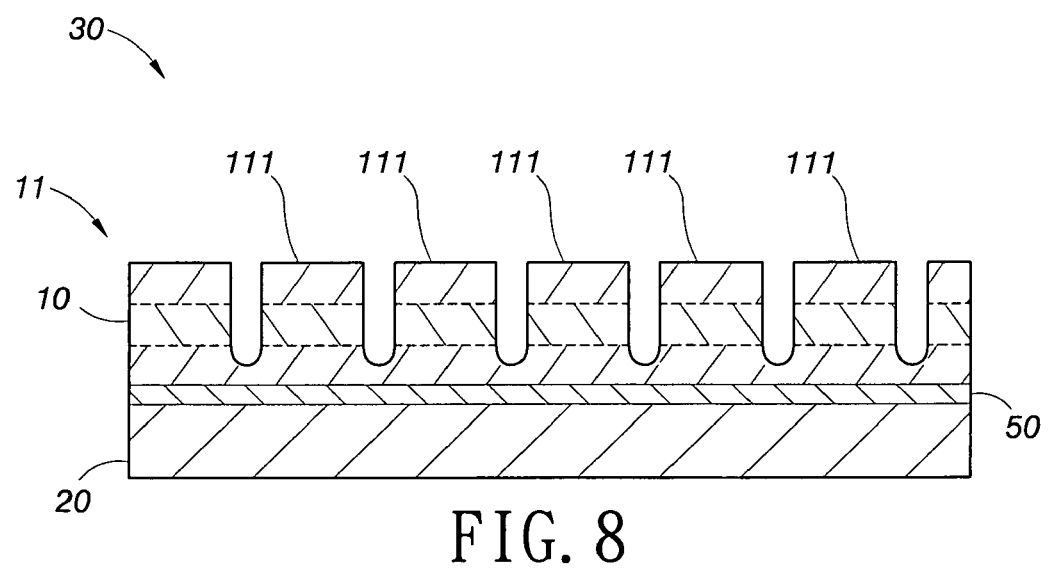
FIG. 8 is a schematic side view, wherein the diffused wafer is a single surface diffused type, the two electrodes provided on a same plane and mutually insulated and separated are make respectively a P/P type electrode.

2. The second step 201: as shown in FIGS. 5 and 8, the diffused wafer 10 is processed on its surface by etching to make a plurality of ditches separated with one another, in order that the diffused wafer 10 is formed thereon a plurality of electrodes 11 separated with one another and all on the identical plane.

Figure 9:
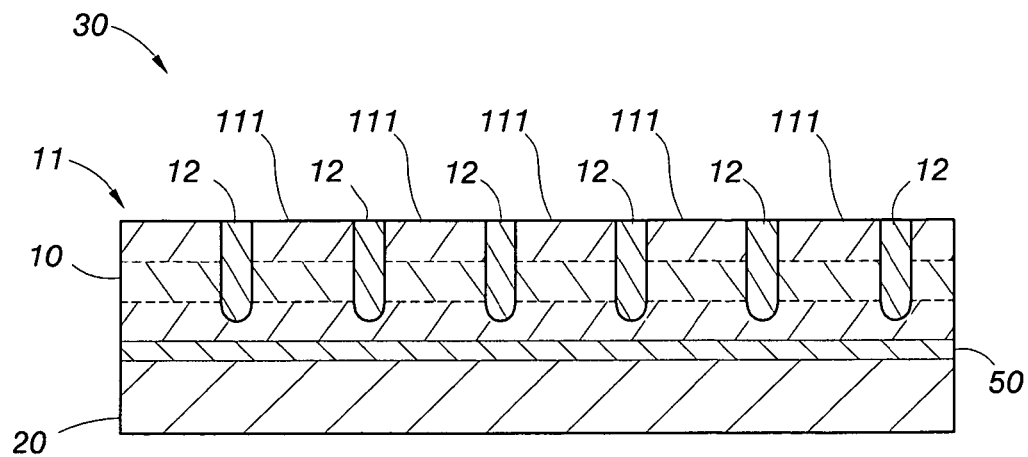
FIG. 9 is a schematic side view of the co-constructure, wherein the diffused wafer is a single surface diffused type, a plurality of ditches separated with one another are filled therein with insulating material, in order that P/P type electrodes provided on an identical plane are mutually insulated and separated.

3. The third step 202: as shown in FIGS. 5 and 9, the ditches separated with one another on the diffused wafer 10 are filled therein with insulation material 12, in order that the electrodes 11 separated with one another and provided on an identical plane are mutually insulated and separated.

Figure 10:
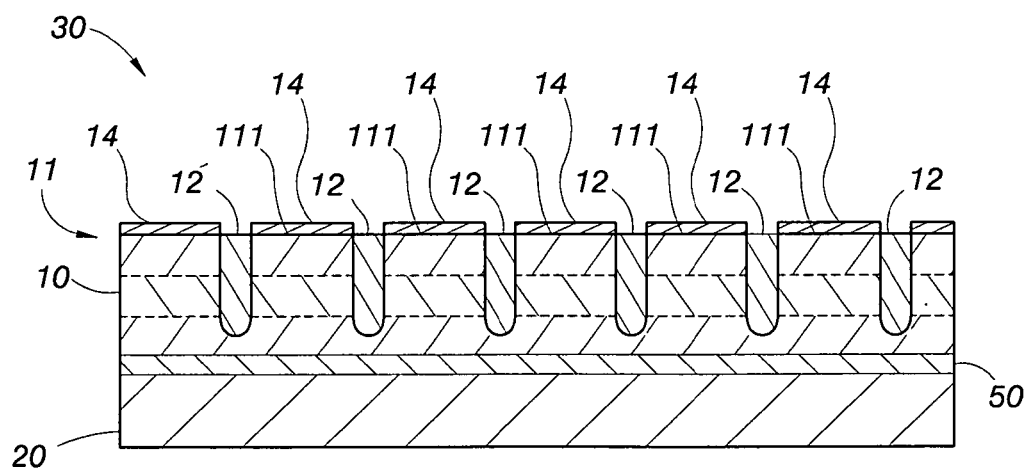
FIG. 10 is a schematic side view of the co-constructure, wherein the diffused wafer is a single surface diffused type, and the surfaces of the electrodes are metalized.

4. The fourth step 203: as shown in FIGS. 5 and 10, the surface of the electrodes 11 of the diffused wafer 10 are metalized to make extension of the electric conductive character of the diffused wafer 10 to the electrodes 11, and production of all the functional lines can be completed.

Figure 11:
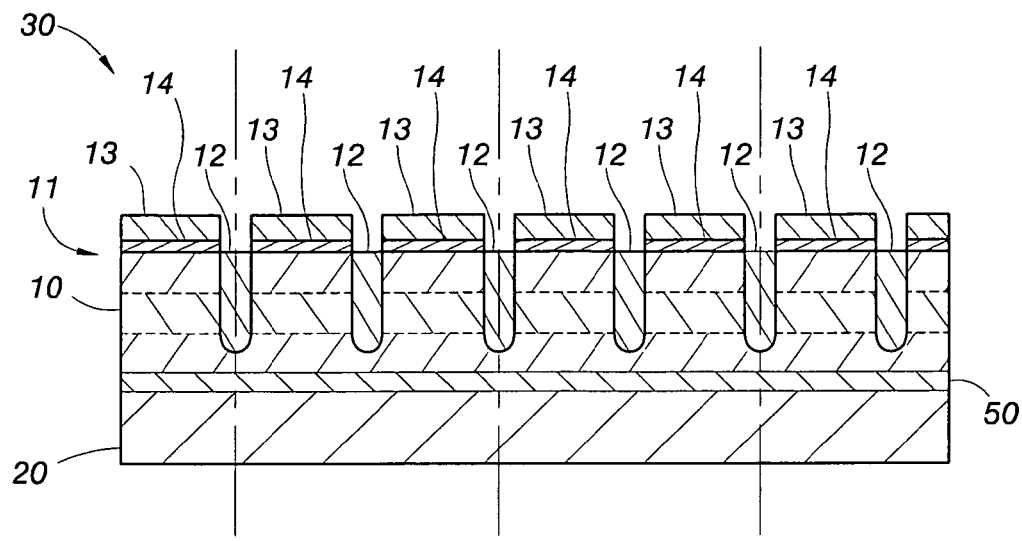
FIG. 11 is a schematic side view of the co-constructure, wherein the diffused wafer is a single surface diffused type, each of the electrodes having its surface metalized is provided with a metallic electrode plate.
Figure 12:
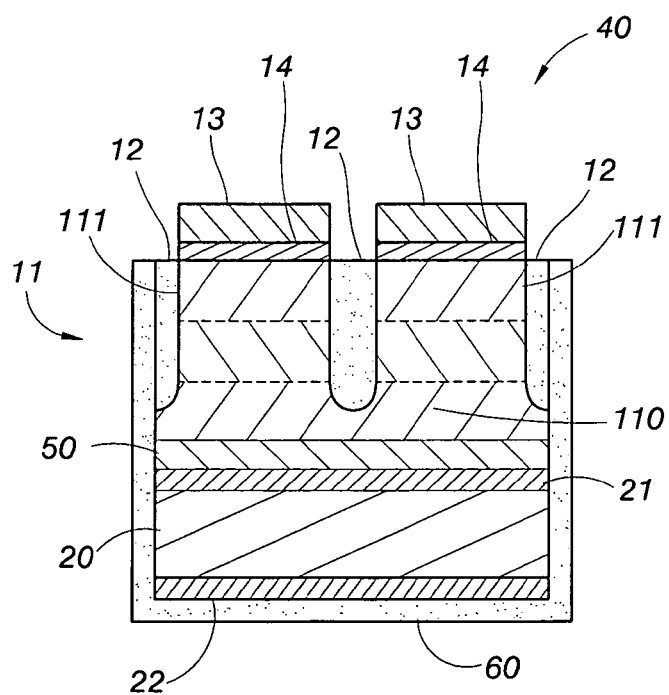
FIG. 12 is a schematic side view, wherein the diffused wafer is a single surface diffused type, of which an individual silicon wafer and a base plate co-construct a surface-mounting type diode.

5. The fifth step 204: as shown in FIGS. 5 and 11, the co-construcutre 30 formed from the diffused wafer 10 and the base plate 20 is cut to form a plurality of separated individuals; and as shown in FIG. 12, the surface of each of the individuals has two electrodes 11 provided on the identical plane and mutually insulated and separated, such that each individual forms a surface-mounting type diode 40 to be applied straight.

Figure 14:
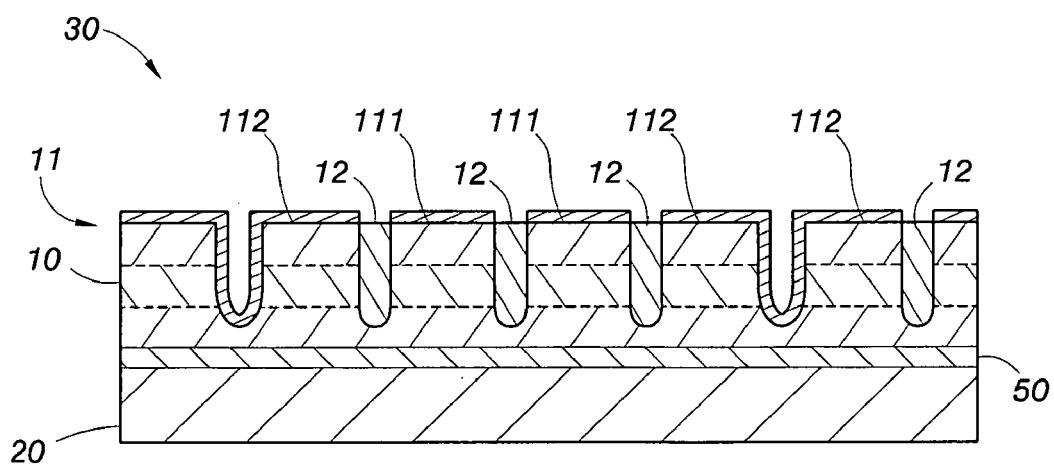
FIG. 14 is a schematic side view of the co-constructure, wherein the diffused wafer is a two surface diffused type, and the metalized surfaces of the wafer includes surfaces of the ditches between N/N type electrodes.

In the above process of manufacturing, if the diffused wafer 10 is a single surface diffused type, a single surface diffused type silicon grain 110 can be formed after cutting, the two electrodes 11 provided on the identical plane and mutually insulated and separated of the aforesaid surface-mounting type diode 40 can be P/P (111, 111) type electrodes or N/N (112, 112) type electrode (as shown in FIGS. 8 and 14), the diode 40 thereby is formed a two way surface-mounting type diode 40.

The mode of practicing the manufacturing process of the present invention is specified in detail as below:

As shown in FIGS. 5 and 7, in the above stated first step 200, for the purpose of easily sintering and melting for connecting the diffused wafer 10 with the base plate 20, the diffused wafer 10 and the base plate 20 can be provided therebetween with a kind of high temperature durable alloy soldering material 50.

In practicing, the base plate 20 can be made of non-conductive material, for instance: ceramic, glass etc., and the top surface of the ceramic and glass base plate 20 can be provided with a metalized connecting layer 21 in order to achieve the object of easily stacking sintering and melting for connecting the diffused wafer 10 with the base plate 20. In practicing, the connecting layer 21 on the base plate 20 can be made by a printing mode a thick film connecting layer, or can be made by an electric plating mode a thin film connecting layer.

Moreover, for the purpose of getting a better heat scattering effect, in practicing, the base plate 20 can be made of conductive material, for instance: gold, silver, copper, iron or aluminum etc., or of semiconductor of higher resistance value. If the material of the base plate 20 is conductive material or non-conductive material in practicing, its bottom shall be provided with a protecting layer 22 to protect the diffused wafer 10 for insulating and avoid getting wetting.

By the fact that the base plate 20 is less subjected to deformation than the diffused wafer 10, and has large stiffness, after co-construction of the diffused wafer 10 with the base plate 20 by sintering and melting for connecting, if the diffused wafer 10 is etching ditched overly deep, or the diffused wafer 10 is ground to be too thin, the diffused wafer 10 will be not subjected to having the problem of breaking, thereby we are not afraid of being collided with of the diffused wafer 10, and further an effect of having the volume of the diffused wafer 10 reduced can be provided.

As shown in FIGS. 5 and 9, in the above third step 202, in practicing, the ditches separated with one another on the diffused wafer 10 are filled with insulation material 12, for instance, by filling glass or providing an oxidized layer etc. in order to achieve the effect of separating the electrodes 11.

As shown in FIGS. 5 and 10, in the above fourth step 203, the purpose that the electrodes 11 on the surface of the diffused wafer 10 are metalized is to make the electrodes 11 more easier to be stuck or soldering connected, and production of all the functional lines can be completed, after metallization, each of the surface metalized electrodes 11 can be added with a metallic electrode plate 13 by the mode of printing or high temperature soldering; as shown in FIG. 11, providing of the metallic electrode plate 13 can be performed after the process of cutting in the fifth step 204.

Besides, as shown in FIG. 5 and FIG. 12, for the purpose of strengthen insulation and protection for each surface-mounting type diode 40 after the process of manufacturing, the surface-mounting type diode 40 can be provided on its outer surface, except the electrodes 11, with an insulation layer 60; in practicing, the insulation layer 60 can be made of solid or liquid epoxy resin or insulating glue that can achieve the object of insulation and protection.

Figure 13:
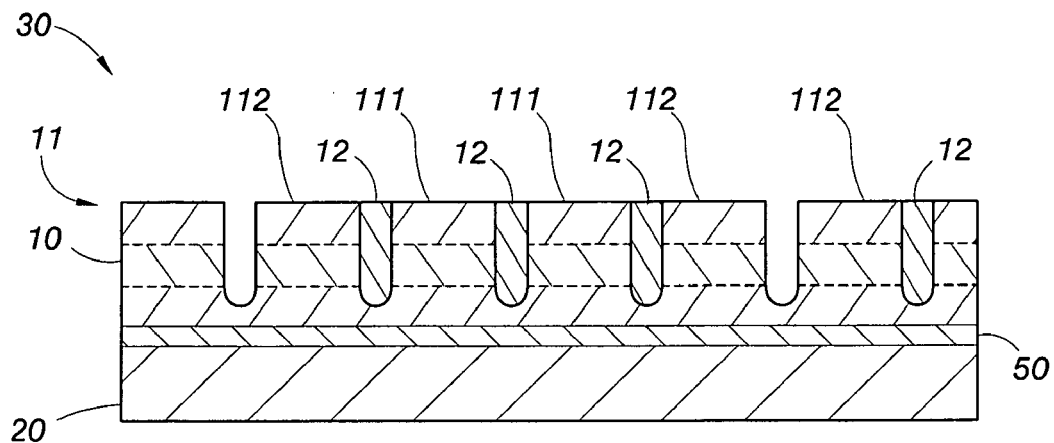
FIG. 13 is a schematic side view of the co-constructure, wherein the diffused wafer is a two surface diffused type, and the electrodes are separated into two P/N type electrodes.
Figure 17:
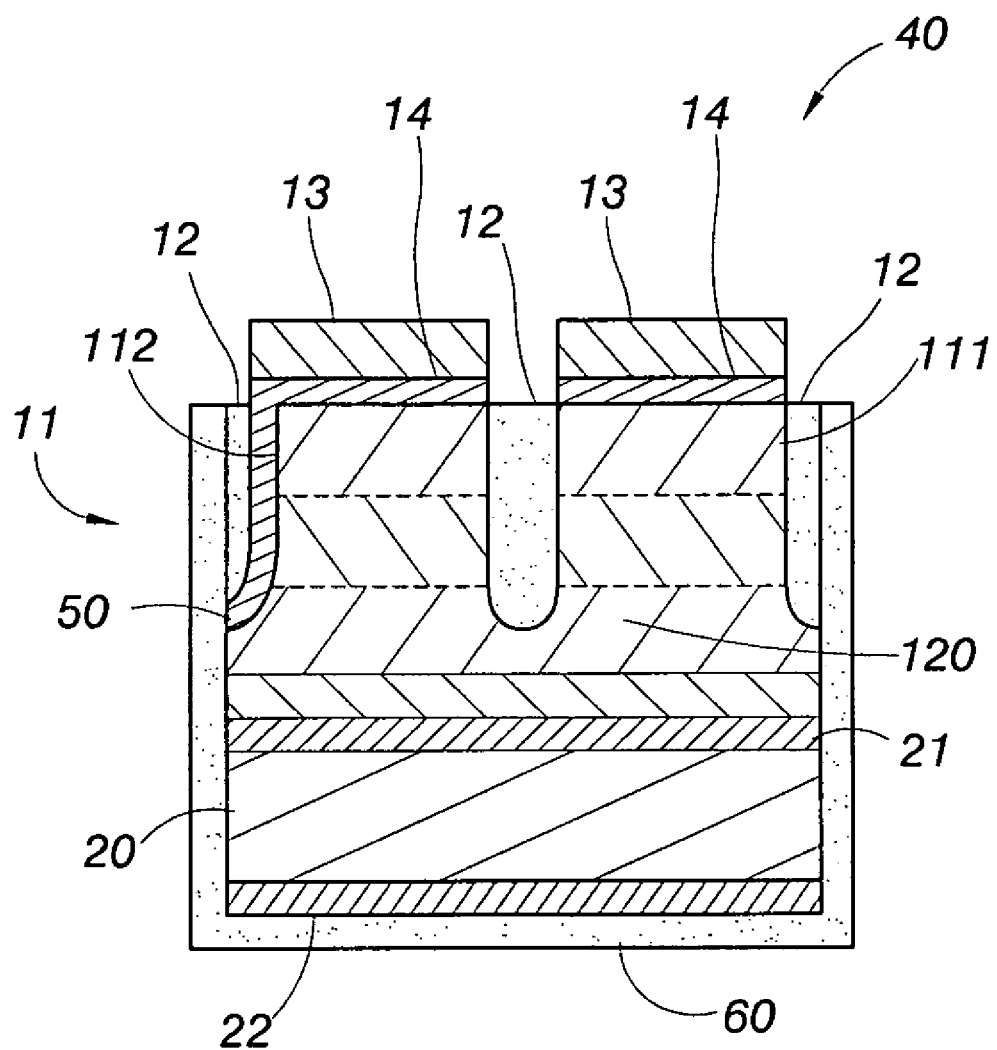
FIG. 17 is a schematic side view, wherein the diffused wafer is a two surface diffused type, of which an individual silicon wafer and a base plate co-construct a surface-mounting type diode.

As shown in FIGS. 5, 13 and 17, in the above manufacturing process, if the diffused wafer 10 is a two surface diffused type, it can be formed a two surface diffused type silicon grain 120 after cutting, thereby the two electrodes 11 which are provided on the identical plane and mutually insulated and separated of the surface-mounting type diode 40 are P/N type electrodes 111, 112, the diode 40 thereby is formed a one way surface-mounting type diode 40.

As shown in FIGS. 5, 14 and 17, the difference between this embodiment of manufacturing process of the one way surface-mounting type diode 40 and the precedent step is: by virtue that the diffused wafer 10 is a two surface diffused type, the diffused wafer 10 must be separated to make the electrodes arranged in PPNNPP . . . , namely 111, 111, 112, 112, therefore during processing of the third step 202, it is not necessary to fill insulating material 12 in the ditches between N/N (112, 112), so that in the fourth step 203, the ditches between N/N (112, 112) and the surfaces of the P, N (111, 112) type electrodes 11 can be metalized; the ditches between N/N (112, 112) can be provided by the processes of etching and ditching or yellow light development before the fourth step 203.

Figure 15:
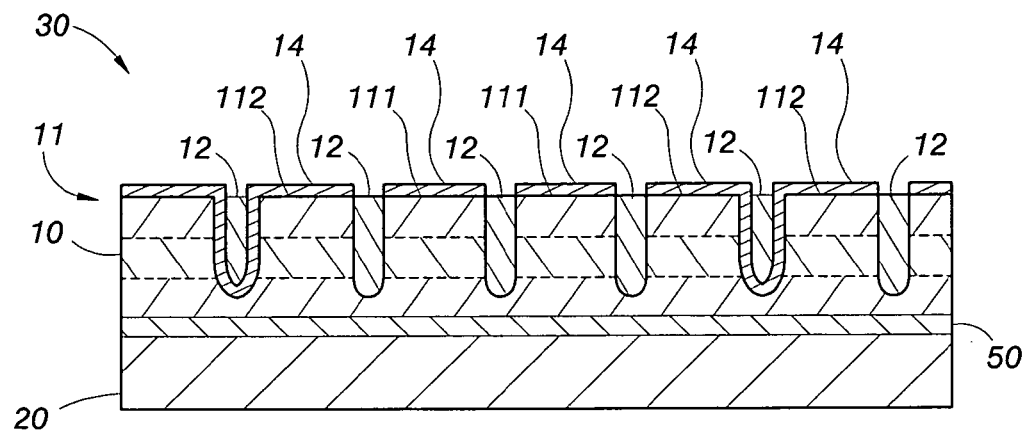
FIG. 15 is a schematic side view of the co-constructure, wherein the diffused wafer is a two surface diffused type, and ditches between N/N type electrodes are filled therein with insulating material.
Figure 16:
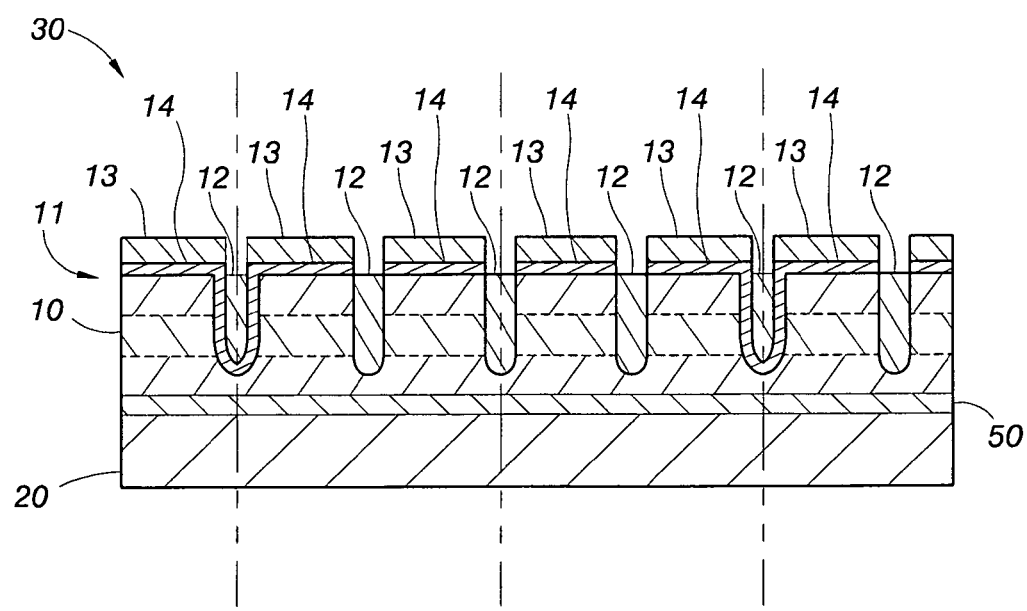
FIG. 16 is a schematic side view of the co-constructure, wherein the diffused wafer is a two surface diffused type, each of the electrodes having its surface metalized is provided with a metallic electrode plate.

As shown in FIGS. 5 and 15, in this embodiment, when the surfaces of the diffused wafer 10 in the fourth step 203 are metalized, the metalized areas also include surfaces of the ditches between N/N (112, 112) type electrodes 11, hence before cutting in the fifth step 204, the ditches between N/N (112, 112) are filled therein with insulating material 12, and as shown in FIGS. 16 and 17, after cutting of the fifth step 204, a plurality of surface-mounting type diodes 40 can be obtained, and a surface of each surface-mounting type diode 40 has two P/N (111, 112) type electrodes 11 provided on the identical plane and mutually insulated and separated, and further each surface-mounting type diode 40 can be applied directly.

For the purpose of strengthen insulation and protection for each surface-mounting type diode 40, in practicing, the surface-mounting type diode 40 can be provided on its outer surface, except the electrodes 11, with an insulation layer 60; in practicing, the insulation layer 60 can be made of solid or liquid epoxy resin or insulating glue that can achieve the object of insulation and protection.

Figure 18:
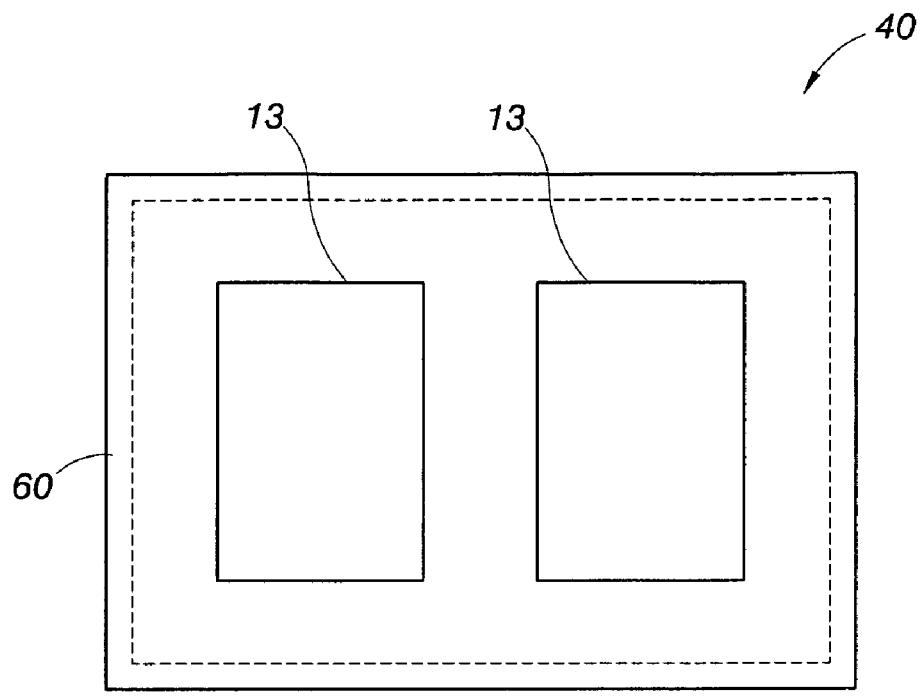
FIG. 18 is a top view of the present invention, showing an individual silicon wafer and a base plate co-construct a surface-mounting type diode.
Figure 19:
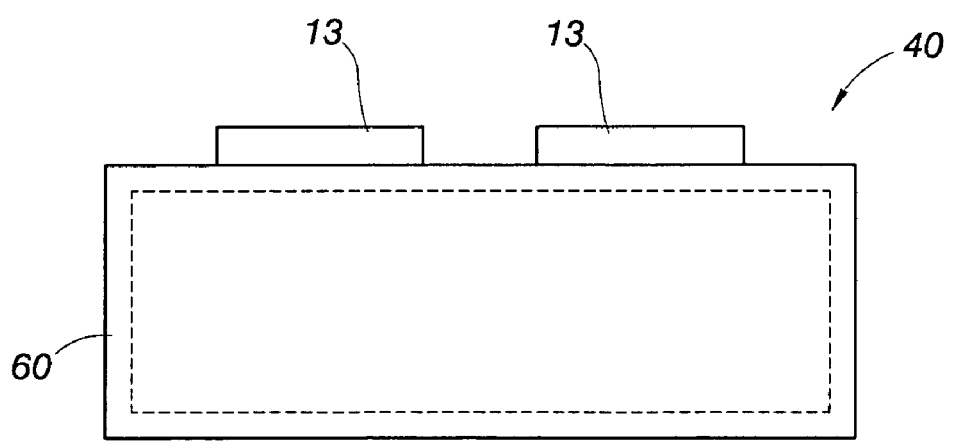
FIG. 19 is a side view of the present invention, showing an individual silicon wafer and a base plate co-construct a surface-mounting type diode.

From the above stated steps, the surface-mounting type diode 40 co-constructed from the silicon wafer and the base plate 20 includes two kinds as to its structure, namely, the structure of the one way surface-mounting type diode 40 and the structure of the two way surface-mounting type diode 40, further specification is provided below:

(1) The structure of the two way surface-mounting type diode 40:

As shown in FIGS. 12, 18 and 19, the surface-mounting type diode 40 comprises: a single surface diffused type silicon grain 110 and a base plate 20 being co-constructed with a bottom surface of the silicon grain 110 by sintering and melting for connecting with each other, wherein the bottom surface of the silicon grain 110 and the base plate 20 are provided therebetween with a kind of high temperature durable alloy soldering material 50, for the purpose of mutually sintering and melting for connecting of the bottom surface of the silicon grain 110 with the base plate 20, and the two electrodes 11 of the silicon grain 110 are provided therearound with mutually separated ditches for filling therein with insulating materials 12, in order to separate the two electrodes 11 provided on an identical plane, which electrodes 11 are respectively a P/P (111, 111) and an N/N (112, 112) type electrode (please refer further to FIG. 13), the outer surface of each electrode 11 is provided with a metalized electric conductive layer 14.

(2) The structure of the one way surface-mounting type diode 40:

As shown in FIGS. 16 to 19, the surface-mounting type diode 40 comprises: a two surface diffused type silicon grain 120 and a base plate 20 being co-constructed with a bottom surface of the silicon grain 120 by sintering and melting for connecting with each other, wherein the bottom surface of the silicon grain 120 and the base plate 20 are provided therebetween with a kind of high temperature durable alloy soldering material 50, for the purpose of mutually sintering and melting for connecting of the silicon grain 120 with the base plate 20, and the two electrodes 11 of the silicon grain 120 are provided therearound with mutually separated ditches for filling therein with insulating materials 12, in order to separate the two P/N (111, 112) type electrodes 11 provided on an identical plane, the surface of each electrode 11 is metalized to provide an electric conductive layer 14, the electric conductive layer 14 is extended from one of the electrodes 11 to an area between a separating ditch (beside the silicon grain 120) and the insulating material 12.

In practicing, the base plate 20 can be made of non-conductive material, for instance: ceramic, glass etc., and the top surface of the ceramic or glass base plate 20 can be provided with a metalized connecting layer 21 in order to achieve the object of easily stacking sintering and melting for connecting the diffused wafer 10 with the base plate 20. In practicing, the connecting layer 21 on the base plate 20 made of ceramic etc. can be made by a printing mode a thick film connecting layer 21, or can be made by an electric plating mode a thin film connecting layer 21.

Moreover, for the purpose of getting a better heat scattering effect, in practicing, the base plate 20 can be made of conductive material, for instance: gold, silver, copper, iron or aluminum etc., or of semiconductor of higher resistance value. If the material of the base plate 20 is conductive material or non-conductive material in practicing, the bottom of the metallic base plate 20 shall be provided with a protecting layer 22 to protect the diffused wafer 10 for insulating and avoid getting wetting. Additionally, in practicing, for the purpose of being convenient for processing and assembling, the outer surface of the metalized electric conductive layer 14 can, in pursuance of requirement, be provided further with another metallic electrode plate 13 being convenient for assembling.

Moreover, for the purpose of strengthen insulation and protection for each surface-mounting type diode 40, in practicing, the surface-mounting type diode 40 can be provided on its outer surface, except the electrodes 11, with an insulation layer 60; in practicing, the insulation layer 60 can be made of solid or liquid epoxy resin or insulating glue that can achieve the object of insulation and protection.

The names of the members composing the present invention and the shape shown in the drawings are only for illustrating a preferred embodiment of the present invention, and not for giving any limitation to the scope of the present invention. Accordingly, my invention may assume numerous forms and is to be construed as including all modifications and variations falling within the scope of the appended claims.

Having thus described my invention, what we claim as new and desire to be secured by Letters Patent of the United States are:

1. A manufacturing method of a surface-mounting type diode co-constructed from a silicon wafer and a base plate, a diffused wafer is stacked with a high temperature durable high strength base plate to have them sintered as well as melted together for connecting with each other, so that said diffused wafer and said base plate form a co-constructure;

said diffused wafer is processed on its surface by etching to make a plurality of ditches separated from one another, in order that said diffused wafer has formed thereon a plurality of electrodes separated from one another and all on a plane;

said ditches separated with one another on said diffused wafer are filled therein with insulation material, in order that said electrodes separated with one another and provided on said same plane are mutually insulated and separated;

said surface of said electrodes of said diffused wafer are metalized to make extension of electric conductive character of said wafer to said electrodes, and production of all functional lines are completed;

said co-constructure formed from said diffused wafer and said base plate is cut to form a plurality of separated devices, surface of each of said devices has two electrodes provided on said same plane and mutually insulated and separated, such that each said individual forms a surface-mounting type diode to be applied straight;

said diffused wafer is a two surface diffused type, said two electrodes which are provided on said same plane and mutually insulated and separated are arranged in PPN-NPP . . . , during processing of said third step, insulating material is not filled in ditches between N/N, and after said ditches between N/N and surfaces of said P, N type electrodes are metalized simultaneously in said fourth step, before cutting in said fifth step, said ditches between N/N are filled therein with insulating material, and after cutting of said fifth step, a plurality of surface-mounting type diodes are obtained, and a surface of each surface-mounting type diode has two P/N electrodes provided on said same plane and mutually insulated and separated.

2. A manufacturing method of a surface-mounting type diode co-constructed from a silicon wafer and a base plate as claimed in claim 1, wherein:

material of said base plate is conductive material or non-conductive material, a bottom surface of said base plate is provided with a protecting layer.

3. A manufacturing method of a surface-mounting type diode co-constructed from a silicon wafer and a base plate as claimed in claim 1, wherein:

said insulation material is chosen from glass and an oxidized layer.

4. A manufacturing method of a surface-mounting type diode co-constructed from a silicon wafer and a base plate as claimed in claim 1, wherein:

each of said electrodes having its surface metalized is provided with a metallic electrode plate to make extension of electric conductive character of said wafer to said electrodes.

5. A manufacturing method of a surface-mounting type diode co-constructed from a silicon wafer and a base plate as claimed in claim 1, wherein:

after said fifth step, said surface-mounting type diode is provided on its outer surface, except said electrodes, with an insulation layer for insulation and protection.

6. A manufacturing method of a surface-mounting type diode co-constructed from a silicon wafer and a base plate as claimed in claim 1, wherein:

for a purpose of easily sintering and melting for connecting said wafer with said base plate, said wafer and said base plate are provided therebetween with a kind of high temperature durable alloy soldering material.

7. A manufacturing method of a surface-mounting type diode co-constructed from a silicon wafer and a base plate as claimed in claim 1, wherein:

a bottom surface of said diffused wafer is metalized in order that said diffused wafer and said base plate are easily sintered as well as molten together for connecting with each other for co-construction.

8. A manufacturing method of a surface-mounting type diode co-constructed from a silicon wafer and a base plate as claimed in claim 1, wherein:

said base plate is made of non-conductive material.

9. A manufacturing method of a surface-mounting type diode co-constructed from a silicon wafer and a base plate as claimed in claim 1, wherein:

material of said base plate is conductive material or non-conductive material, a bottom surface of said base plate is provided with a protecting layer.

10. A manufacturing method of a surface-mounting type diode co-constructed from a silicon wafer and a base plate as claimed in claim 1, wherein:

said insulation material is chosen from glass and an oxidized layer.

11. A manufacturing method of a surface-mounting type diode co-constructed from a silicon wafer and a base plate as claimed in claim 1, wherein:

each of said electrodes having its surface metalized is provided with a metallic electrode plate to make extension of electric conductive character of said wafer to said electrodes.

12. A manufacturing method of a surface-mounting type diode co-constructed from a silicon wafer and a base plate as claimed in claim 1, wherein:

after said fifth step, said surface-mounting type diode is provided on its outer surface, except said electrodes, with an insulation layer for insulation and protection.

* * * * *